United States Patent [19]

Hshieh

[11] Patent Number: 6,031,265
[45] Date of Patent: Feb. 29, 2000

[54] ENHANCING DMOS DEVICE RUGGEDNESS BY REDUCING TRANSISTOR PARASITIC RESISTANCE AND BY INDUCING BREAKDOWN NEAR GATE RUNNERS AND TERMINATION AREA

[75] Inventor: Fwu-Iuan Hshieh, Saratoga, Calif.

[73] Assignee: Magepower Semiconductor Corp., San Jose, Calif.

[21] Appl. No.: 08/951,622

[22] Filed: Oct. 16, 1997

[51] Int. Cl.[7] .......................... H01L 29/10; H01L 29/78; H01L 29/68
[52] U.S. Cl. .......................... 257/334; 257/339; 257/356
[58] Field of Search .................. 257/328, 330, 257/331, 334, 339, 355, 356

[56] References Cited

U.S. PATENT DOCUMENTS

| 5,072,266 | 12/1991 | Bulucea et al. | 257/359 |
| 5,558,313 | 9/1996 | Hshieh et al. | 257/342 |
| 5,814,858 | 9/1998 | Williams | 257/328 |
| 5,818,084 | 10/1998 | Williams et al. | 257/329 |

Primary Examiner—Donald L. Monin, Jr.
Attorney, Agent, or Firm—Bo-In Lin

[57] ABSTRACT

This invention discloses a vertical DMOS power device formed in a semiconductor substrate with a top surface and a bottom surface. The power device includes a core cell area and a gate runner area. The power device includes a plurality of vertical DMOS transistor cells disposed in the core cell area wherein each transistor cell includes a drain of a first conductivity type disposed at the bottom surface of the substrate. Each of the DMOS transistor cells further includes a trench surrounding the cell having a polysilicon disposed in the trench defining a gate for the transistor cell. Each of the transistor cells further includes a source region of the first conductivity type disposed in the substrate near the gate. Each of the transistor cells further includes a body region of a second conductivity type disposed in the substrate between the gate wherein the body region defining a vertical current channel along the trench between the source and the drain. The power device further includes a plurality of trenched polysilicon fingers extended from the trenched gate to the gate runner area. The power device further includes a plurality of ruggedness enhancing body dopant regions of the second conductivity type disposed in the substrate between the trenched polysilicon fingers and in a termination, each of the ruggedness enhancing body dopant regions further includes a breakdown-inducing-regions disposed at bottom of the body dopant region at a depth below the trenched gate-extension fingers having a higher dopant concentration of the second conductivity type for inducing a breakdown therein. In a preferred embodiment, each of the vertical DMOS further includes a deep high concentration dopant region disposed in the body region below the source having a higher dopant concentration than the body region.

15 Claims, 11 Drawing Sheets

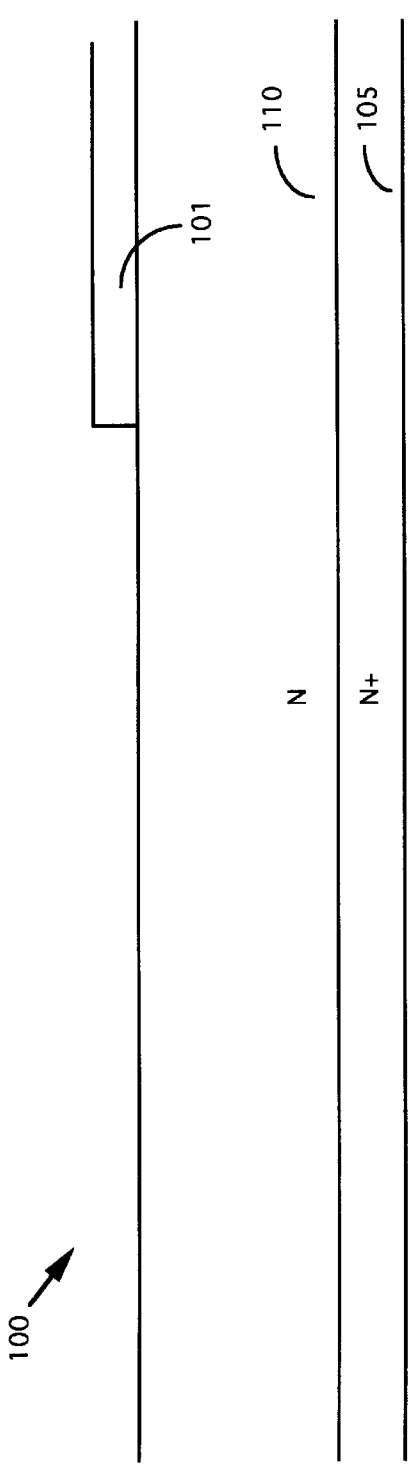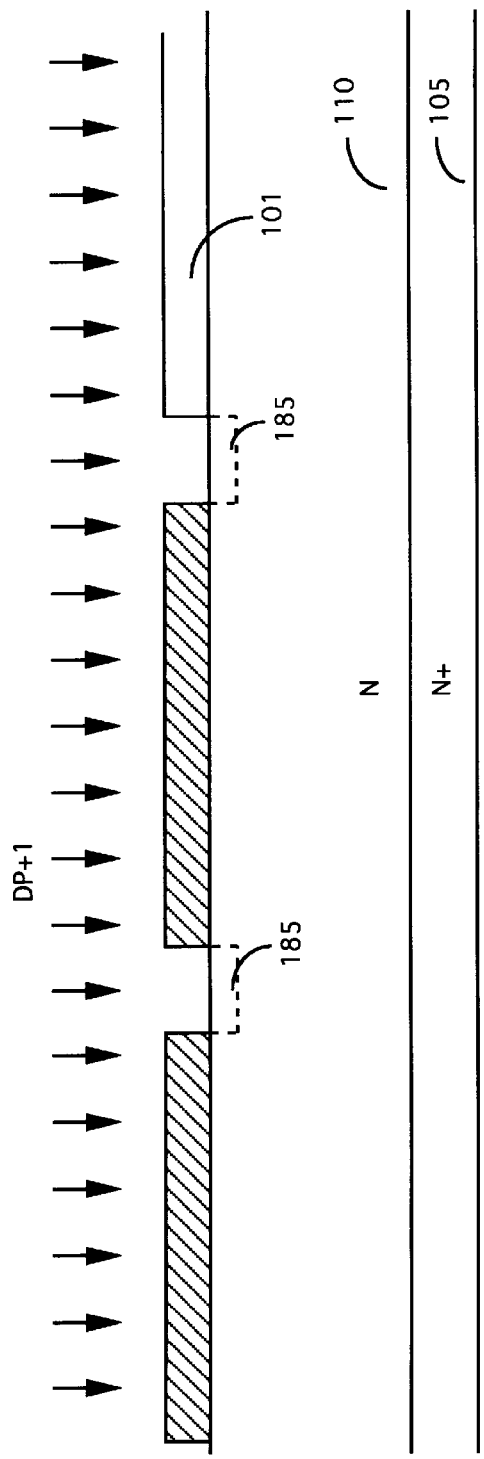

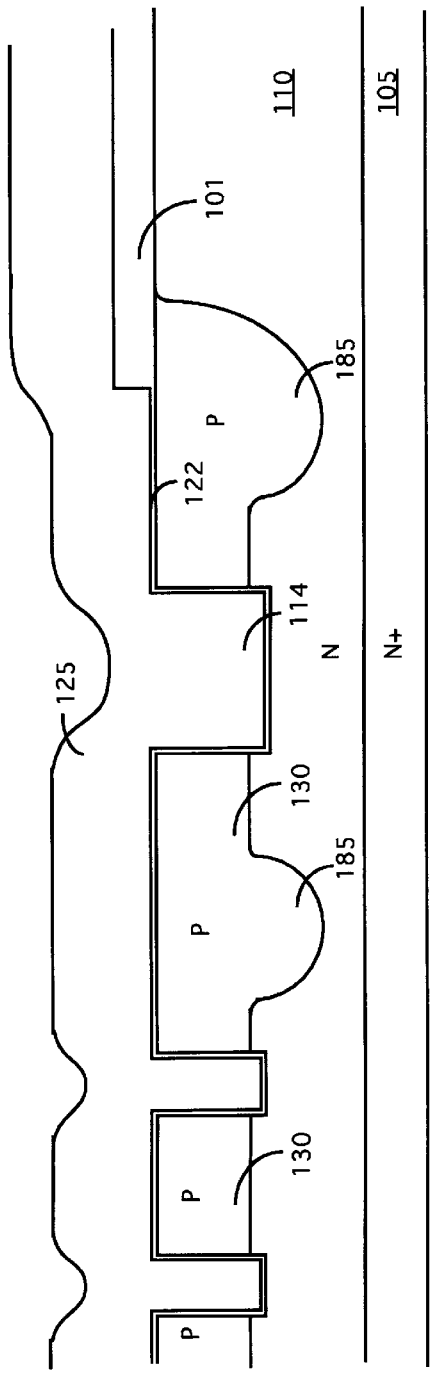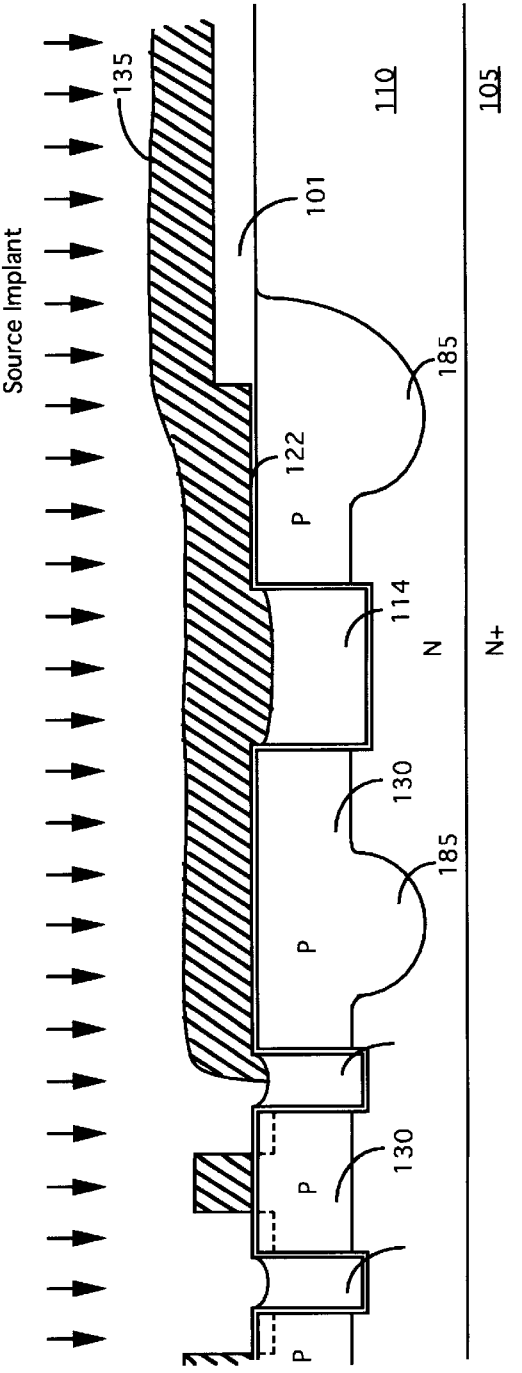

ENHANCING DMOS DEVICE RUGGEDNESS BY REDUCING TRANSISTOR PARASITIC RESISTANCE AND BY INDUCING BREAKDOWN NEAR GATE RUNNERS AND TERMINATION AREA

BACKGROUND OF THE INVENTION

1. Field of the Invention

This invention relates generally to the structure and fabrication process of trenched DMOS power transistors. More particularly, this invention relates to a novel and improved structure and process for fabricating high density trenched DMOS power device with strengthened device ruggedness by inducing the avalanche breakdown to occur in the deep body regions near the gate runners, outside of the active area, and in the termination area rather than in the core cell areas underneath the DMOS transistor cells.

2. Description of the Prior Art

Many cell structures are disclosed for the purpose of strengthening the device ruggedness and one example of such devices is disclosed in U.S. Pat. No. 5,072,266 by Bulucea et al. Referring to FIG. 1 for the cell structure of this trench DMOS transistor. The trench DMOS transistor by Bulecea et al. as shown in FIG. 1 provides the advantages that this device has a good ruggedness because of a deep p+ body which is made deeper than the trench gate. Bulucea et al. disclose a device structure and fabrication method to achieve a controlled bulk semiconductor breakdown. The object of prevent a trench surface breakdown by controlling a bulk breakdown is achieved by taking advantage of the position of the gate in the trench and by using a two dimensional "field-shaping" doping profile including a central deep p+ layer that is laterally adjacent to a p body layer and vertically adjacent to an epitaxial layer of appropriate thickness. The device disclosed by this invention provides an improved device profile to suppress the surface breakdown. The transistor also has a good gate oxide integrity at the bottom of the trench gate since the avalanche breakdown is directed to occur below the deep p+ body.

However, even with improved device ruggedness, the device structure disclosed by Bulecea et al. is not suitable for making trench DMOS device with smaller cell size. The reason of this limitation can be explained by referring to FIG. 1 for the patented device profile wherein the p-body regions 25 is formed to be deeper than the trench 40. The deep p-body regions 25 in the trench DMOS 70 disclosed by Bulucea et al. generate an undesirable side effect of creating the JFET regions between the deeper p-body thus causing the JFET resistance R-JFET to increase. Particularly for a high density device when the source regions are reduced to smaller dimension, a profile with the deeper p-body regions extend beneath the bottom of the trench would further reduce the width of the JFET regions thus causing further increase of the JFET resistance. Moreover, the threshold voltage of a device Vth is significantly increased due to a lateral diffusion of the p+ dopant to touch the channel regions.

In order to overcome this limitation, Ueno discloses in a U.S. Pat. No. 5,086,007, entitled "Method of manufacturing an insulated Field Effect Transistor" (issued on Feb. 4, 1992), an improved insulated gate field effect transistor, e.g., a power MOSFET or an insulated gate bipolar transistor (IGBT). The structure of the Ueno's transistor which is formed in a semiconductor substrate with the drain, gate and source regions vertically disposed is shown in FIG. 2 as a cross sectional view. This vertical MOSFET device disclosed by Ueno includes a specially configured trench MOSFET transistor cell which is manufactured by a simplified method employing only a trench mask. In Ueno's process, a trench mask is employed to form the trenches first which are then filled with polysilicon as gate material. An etch process is carried out to completely remove the polysilicon layer from the top surface of the substrate and a top portion in the trenches. The P-body implant and diffusion processes are performed to form the p-body followed by insulating the top portion of the trenches with an insulating material. A novel feature of this invention is to form the narrow source regions along the top edges of the trenches by a diffusion process. Narrow diffusion regions are formed by diffusion without requiring a source mask Source contact are then formed over the top surface of the device.

With Ueno's simplified processes, the body and source regions are formed with self alignment after forming the gates in the trenches, the size of the transistor cells can be more conveniently reduced without being limited by the concerns of failure in satisfying a misalignment tolerance requirement. Ueno's invention further provides a simplified manufacture process such that the production cost can be reduced. A Ueno's device as shown in FIG. 2 however presents several technical difficulties. A poor ohmic contact of the source region to the metal contact is produced as a result of this manufacture process. As the source regions are formed by a diffusion process, the source doping concentration at the interface between the contact metal and the source regions is formed with a Gaussian distribution. The dopant concentration drops rapidly along a distance away from the trench edge. Due to a low doping concentration at the interface between the source region and the metal contact, the ohmic contact formed there has a poor performance characteristic. Poor ohmic contact also occurs between metal and p-body due to the p+ region in the device structure. The ruggedness of the device is adversely affected due to a higher sheet resistance over the p-body since the parasitic NPN transistor becomes more susceptible to be incidentally turned on as the body resistance is increased which causes the voltage drop across the body region to increase. Therefore, even with a structure and processing method of manufacture to improve the transistor cell as described above, Ueno's device does not provide a complete and satisfactory solution to overcome the difficulties faced by the industry in an effort to further miniaturize the power DMOS transistors.

Therefore, a need still exits in the art of power device fabrication, particularly for DMOS design and fabrication, to provide a structure and fabrication process that would resolve these difficulties. More specifically, it is preferably that a transistor with a high cell density can be produced with strengthened ruggedness and reduced body resistance and body contact resistance such that the difficulties as discussed above can be resolved.

SUMMARY OF THE PRESENT INVENTION

It is therefore an object of the present invention to provide an improved trench DMOS structure, and fabrication process to overcome the aforementioned difficulties encountered in the prior art.

Specifically, it is an object of the present invention to provide an improved trench DMOS structure and fabrication process wherein the high density DMOS device is manufactured with transistor cells having a reduced drain to source resistance $R_{ds}$ by forming body regions with a flat-bottom in the core cell area such that the difficulties of JFET resistance between the deep-body regions in the core cells for high density DMOS device as that incurred in the prior art can be resolved.

Another object of this invention is provide an improved trench DMOS device to include a breakdown inducing region by forming deep body dopant region between the polysflicon fingers near the gate runner and in the termination areas such that avalanche breakdown is induced to occur in the deep body dopant region away from the transistor cells such that the deep body regions in the core cell area for strengthening the device ruggedness as that implemented in the prior art is no longer necessary.

Another object of the present invention is to provide an improved trench DMOS structure and fabrication process wherein the DMOS transistor is manufactured with an below-the-source high concentration body dopant region inside the body region which has a flat-bottom shape with a depth shallower than the trenches such that the parasitic resistance over the body region is reduced and the device ruggedness is further improved.

Another object of the present invention is to provide an improved trench DMOS structure and fabrication process wherein the high density DMOS device is manufactured with an integrated body regions of greater volume and each of these integrated body regions is provided with a breakdown inducing region by forming deep body dopant region between the polysilicon fingers deeper than the trenches near the gate runner such that the device ruggedness is further improved because the breakdown is induced to occur in the bottom of the integrated body regions which have greater volumes.

Briefly, in a preferred embodiment, the present invention discloses a vertical DMOS power device formed in a semiconductor substrate with a top surface and a bottom surface. The power device includes a core cell area and a gate runner area next to a termination area disposed on a peripheral of the power device. The power device includes a plurality of vertical DMOS transistor cells disposed in the core cell area wherein each transistor cell includes a drain of a first conductivity type disposed at the bottom surface of the substrate. Each of the DMOS transistor cells further includes a trench surrounding the cell having a polysilicon disposed in the trench defining a gate for the transistor cell. Each of the transistor cells further includes a source region of the first conductivity type disposed in the substrate near the gate. Each of the transistor cells further includes a body region of a second conductivity type disposed in the substrate between the gate wherein the body region defining a vertical current channel along the trench between the source and the drain. The power device further includes a plurality of trenched polysilicon fingers extended from the trenched gate to the gate runner area. The power device further includes a plurality of ruggedness enhancing body dopant regions of the second conductivity type disposed in the substrate between the trenched polysilicon fingers each of the ruggedness enhancing body dopant regions further includes a breakdown-inducing-regions disposed at bottom of the body dopant region at a depth below the trenched gate-extension fingers having a higher dopant concentration of the second conductivity type for inducing a breakdown therein.

In a preferred embodiment, each of the vertical DMOS further includes a below-the-source high concentration dopant region disposed in the flat-bottom-shaped body region below the source having a higher dopant concentration than the body region. In a preferred embodiment, the power device further includes a trenched gate runner include a trench with a gate-runner polysilicon therein, the trenched gate runner intersecting the polysilicon fingers, and the gate runner having a width substantial greater than the polysilicon fingers provided for forming a gate contact thereon. In a preferred embodiment, the trenched gate runner having a width of about two to three micrometers and the polysilicon fingers having a width of about one micrometer. In another preferred embodiment, the first conductivity type is a N-type conductivity and the vertical DMOS transistor cells are N-channel DMOS cells. In another preferred embodiment, the breakdown inducing regions between the trenched polysilicon fingers are in electrical contact with each other through a deep body dopant region underneath the polysilicon fingers thus constituting an integrated ruggedness enhancing body dopant regions in the gate runner area.

The present invention further discloses a method for fabricating a DMOS transistor on a substrate which has high cell density, enhanced ruggedness and reduced parasitic resistance. The method includes the steps of: (a) forming an epi-layer of a first conductivity type as a drain region on the substrate followed by growing an initial oxide layer and applying an active mask for etching and defining an active region; (b) applying a breakdown-inducing-body-dopant-region mask for implanting a breakdown inducing body dopant region in a gate runner area between the polysilicon fingers and in a termination area; (c) performing a blank body implant with impurities of a second conductivity type followed by a body-diffusion process at an elevated temperature thus forming a body layer; (d) applying a trench mask for etching the a plurality of trenches wherein the trenches are opened having a depth greater than the bottom of the body layer, the trenches include a plurality of polysilicon finger trenches extending from the core cell area to the gate runner area; (e) removing the trench mask followed by depositing and removing a gate material from the top surface of the trenches thus forming a plurality of trenches and polysilicon fingers filled with the gate material extending from the core cell area to the gate runner area; (f) applying a source mask for performing source implant for forming a plurality of source regions followed by removing the source mask; (g) depositing an insulation layer on top of the power device followed by applying a contact mask for opening a plurality of source and gate contact openings followed by removing the contact mask; and (i) depositing a metal layer and applying a metal mask for etching and defining the gate metal and source metal segments. In a preferred embodiment, the step (g) of opening a plurality of source and gate contact openings further includes a step (g1) of performing a below-the-source high concentration body dopant implant through the source and gate openings to form a plurality of below-the-source high concentration body dopant regions in the body regions below the source regions before removing the contact mask.

These and other objects and advantages of the present invention will no doubt become obvious to those of ordinary skill in the art after having read the following detailed description of the preferred embodiment which is illustrated in the various drawing figures.

BRIEF DESCRIPTION OF THE DRAWINGS

FIGS. 4A to 4H is a series of cross sectional views for showing the manufacture process of a novel trench DMOS transistor including a below-the-source body dopant region in the core cell area and a breakdown inducing region formed as a deep body dopant region between the trenched polysilicon fingers near the gate runner and in the termination area to increase the device ruggedness of the trench DMOS device;

DETAILED DESCRIPTION OF THE PREFERRED EMBODIMENT

Figure 1:
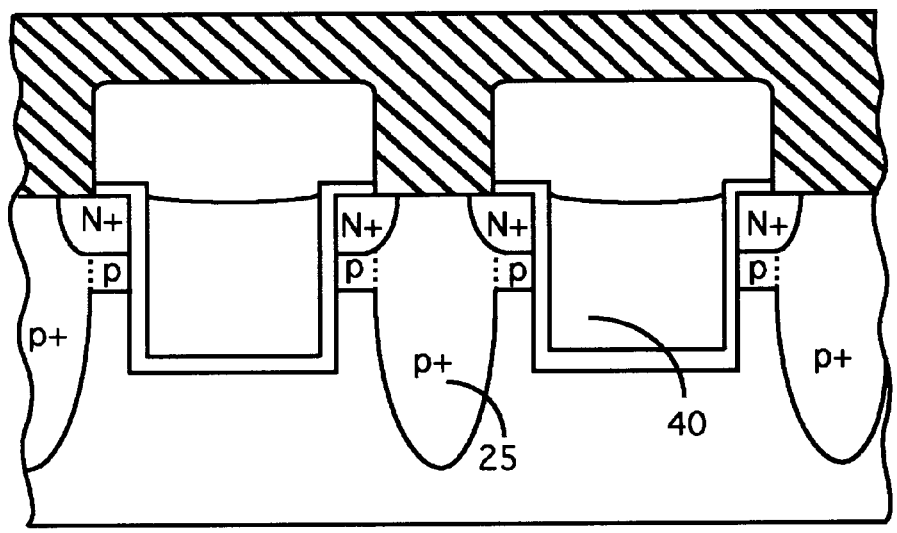
FIG. 1 is a cross-sectional view of trench DMOS cell of a prior art including a deep p-body below the trenches in order to suppress breakdown in the gate oxide near the bottom corner of the trenches and improve the device ruggedness.
Figure 2:
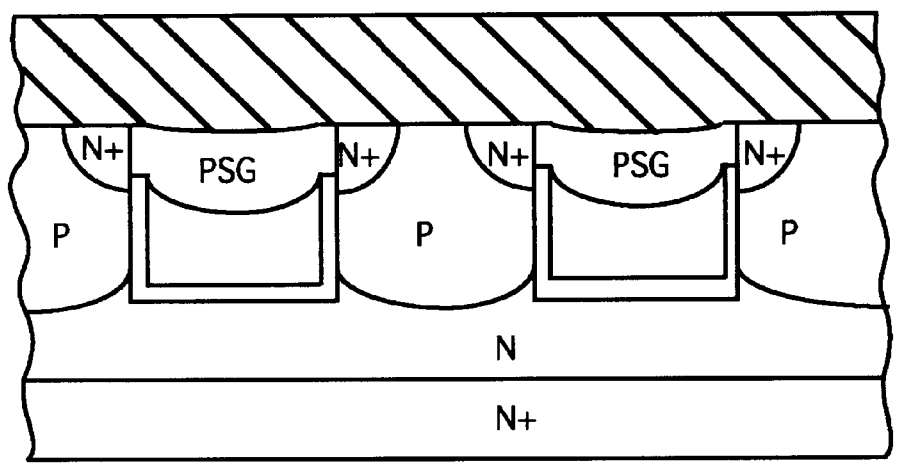
FIG. 2 is a cross-sectional view of another trench DMOS cell of a prior art including source regions formed by diffusion on the top portion of trench edges.
Figure 3A:
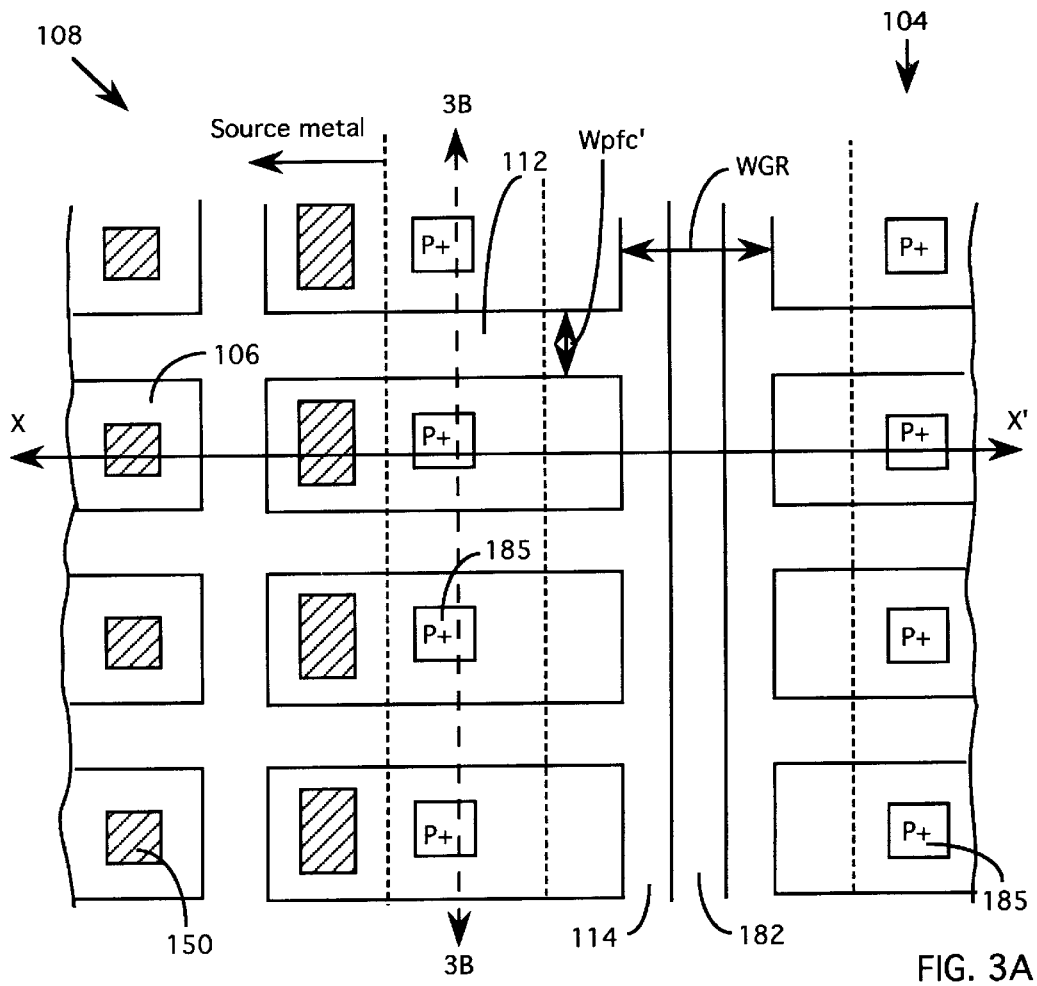
FIGS. 3A to 3C are respectively top view and cross sectional views for a preferred embodiment of the present invention showing the structure of transistor cells and breakdown inducing regions between the trenched polysilicon fingers in the gate runner area and in a termination area with a field plate for a novel trench DMOS device.
Figure 3B:
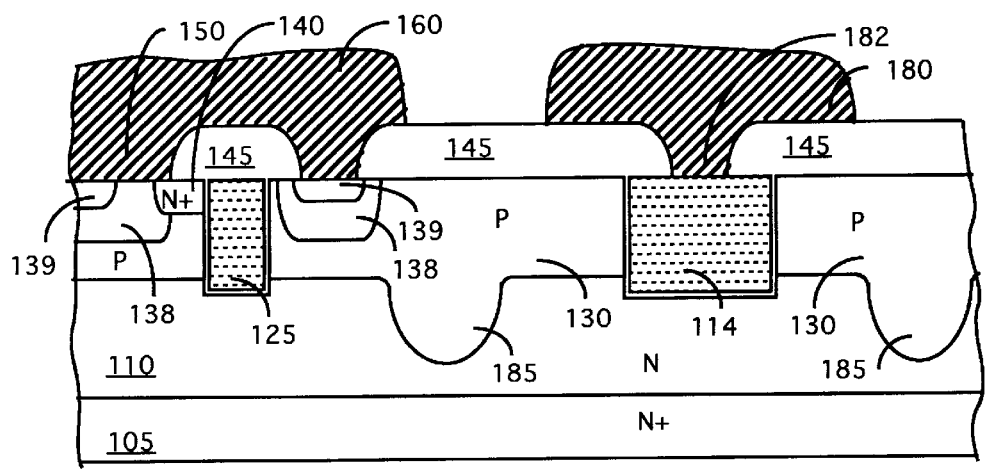

FIGS. 3A and 3B show a top view and a cross sectional view respectively of a trenched DMOS device 100 of the present invention includes a core cell area 108, a gate runner area 102 having a metal gate runner 180, and a termination area 104. The trenched DMOS device 100 is formed on a N+ substrate 105 supporting a N epi-layer 110 thereon (referring to FIG. 3B). The DMOS device 100 includes a plurality of transistor cells 106 in the core cell area 108. The transistor cells 106 with the gate metal area 102 and the termination area 104 are formed on a N epitaxial layer 110 supported on a N+ substrate 105 function as a drain for each of the transistor cells 106. Each transistor cell 106 includes a trenched gate 125 surrounded by a N+ source region 140 formed next to the trenched gate 125. A P-body region 130 having a flat-bottom shallower than the trenched gates surrounds the source region 140 and extend away from the trenched gate 125 to next cell. Each transistor cell 106 further includes a below-the source P+ region 138 formed in the P-body region under the source regions 140 is formed for the purpose of reducing the parasitic resistance. The below-the-source body dopant region 138 for reducing the parasitic resistance has a higher P-dopant concentration than the surrounding P-body thus lowering the parasitic resistance over the body region 130 and improving the ruggedness of the transistor cell. This is achieved by decreasing the voltage drop across the body regions by reducing the parasitic resistance thus decreasing the likelihood of incidentally turning on the parasitic NPN transistors. In the body region 130, near the top surface, there is also a shallow high concentration body dopant region 139 for reducing the contact resistance between the source metal 170 and the source region 140. Above the top surface of the supporting substrate, an insulation layer 145 is formed to protect and insulate the DMOS transistor with a plurality of source contact openings 150 to form an electric contact among the source regions 140, the shallow p+ regions 139 and the source metal layer 160.

A plurality of trenched polysilicon fingers 112 are formed to extend from the trenched gates 125 of the transistor cells 106 in the core cell area 108 to the gate metal area 102 next to the termination area 104. In the gate metal area 102, a trenched gate runner 114 is formed to connect to a plurality of polysilicon fingers 112 and to form a gate contact opening 182. The trenched gate runner 114 is formed with greater width, i.e., $W_{GR} > 2 W_{PF}$ where $W_{GR}$ is the width of the gate runner 114 and $W_{PF}$ is the width of the polysilicon fingers 112. By providing a gate runner 114 with extra width, i.e., $W_{GR} > W_{PF}$, a gate contact opening 182 for the gate metal 180 to contact the polysilicon in the trench of the gate runner 114 directly without requiring to form a separate above-the-trench polysilicon layer from either the polysilicon fingers 112 or the gate runner 114 to form an above the trench gate contact as that usually implemented in a conventional trench DMOS device.

Figure 3C:
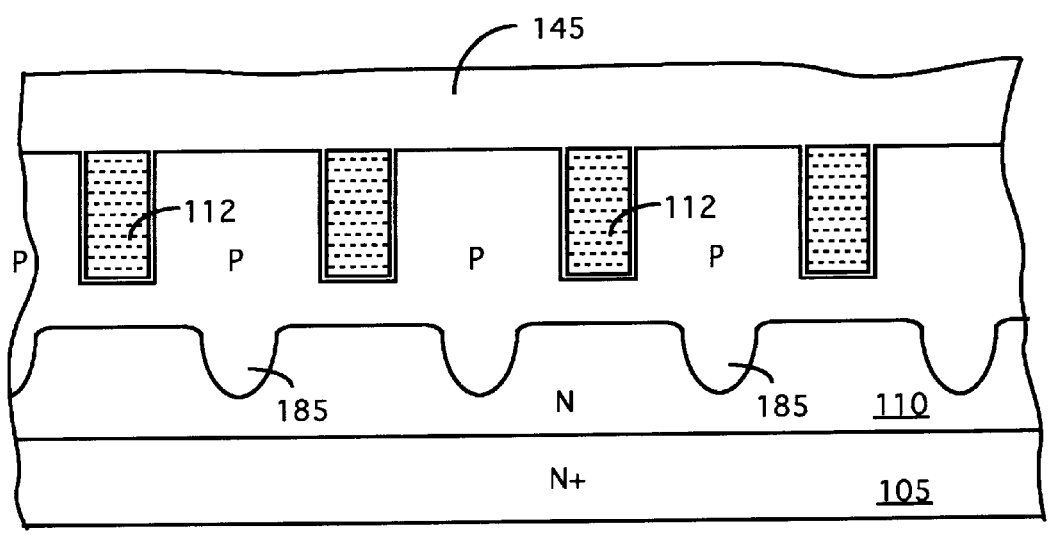

For the purpose of increasing the device ruggedness, a plurality of deep-body dopant breakdown inducing regions 185 are formed between the polysilicon fingers 112 and laterally between the source metal layer 160 and the gate metal 180. The deep-body dopant break down regions 185 are formed with a greater depth than the bottom of the trenches of the polysilicon fingers 112. Therefore, the P-body in the entire region in the substrate near the gate metal 180 are interconnected with the portions of the deep-body dopant breakdown region 185 underneath the trenches polysilicon fingers 112 (refer to FIG. 3C for a cross sectional view along the line C–C'). With the avalanche breakdown is induced to first occur in the deep body dopant regions 185 between the polysilicon fingers near the gate metal 180 and close to the termination area, the device ruggedness is further improved. This is because the body regions 130' near the gate contact metal 180 are interconnected as an integrated body region 130' which has greater integrated volume through this interconnection provided by the underneath-trench portions of the deep-body dopant breakdown inducing regions 185. The avalanche currents generated near the gate runner 180 and the termination area 104 are drawn to flow directly to the source metal before traveling into the core cell area 108. Therefore, the risk caused by a potential problem due to incidentally turning on of the parasitic bipolar NPN transistors in the core cell area by random avalanche breakdown currents is significantly reduced.

Figure 3D:
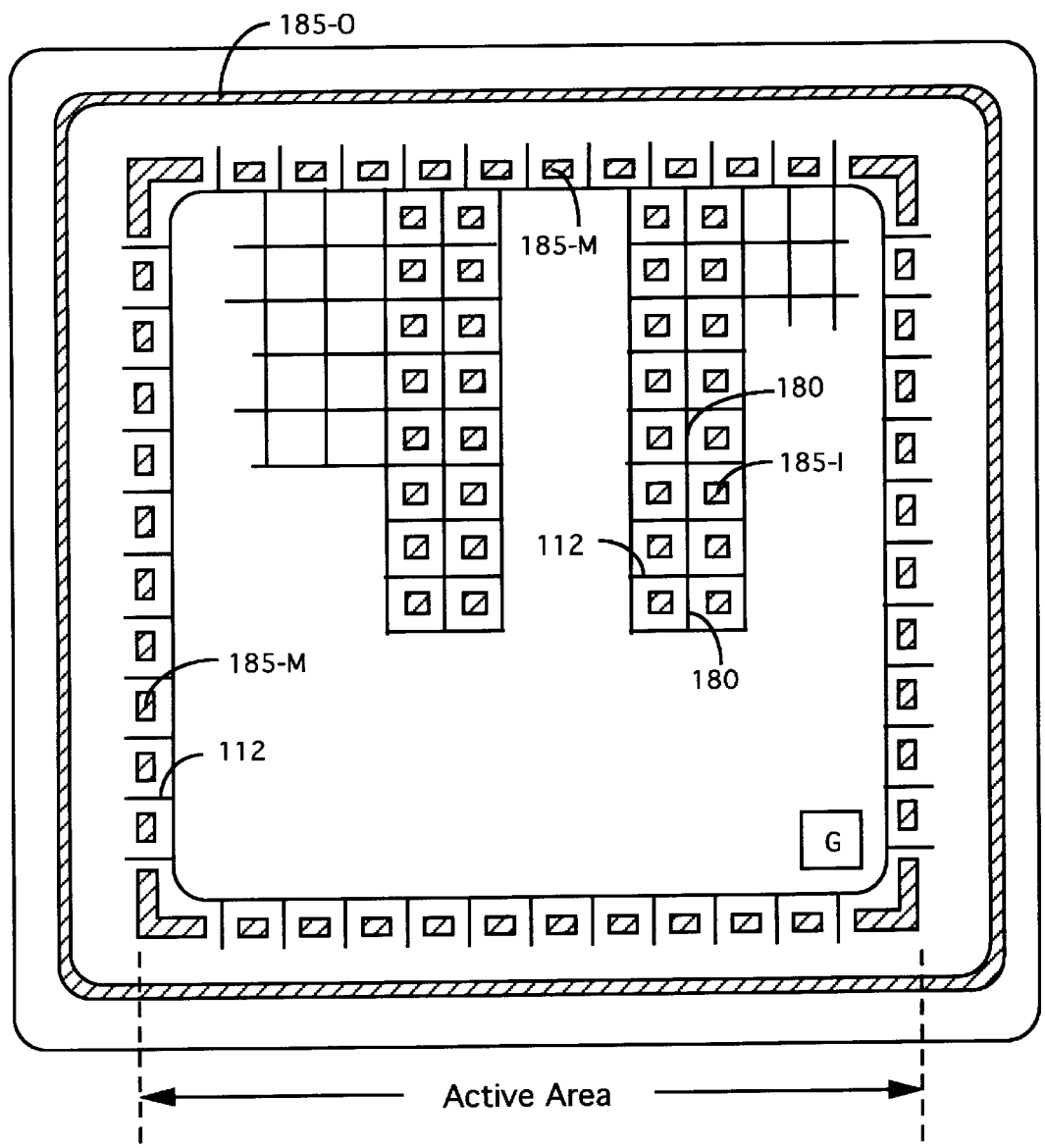
FIG. 3D is a top view of three types of deep high concentration body dopant regions function as breakdown inducing regions.

FIG. 3D is a top view to show the locations of these break down inducing regions 185. In the termination area 104, a ring of deep p+ region is formed as the outer breakdown inducing region 185-O. A plurality of deep p+ regions are formed just outside of the active area between the polysilicon fingers 112 as the middle breakdown inducing regions 185-M. Inside the active area, between a plurality of polysilicon fingers 112, near the gate runners 180, a plurality of inner breakdown inducing regions 185-I. These three types of breakdown inducing regions reduce the likelihood that an avalanche breakdown will first occur in the core cell areas. The DMOS device configured according to this configuration has a significantly enhanced ruggedness because the probability that a parasitic NPN transistor being incidentally turned on by free charge particles generated from breakdown is reduced. The breakdown of the DMOS device as now disclosed is induced to first occur in the deep body dopant regions 185-O, 185-M and 185-I which are away from the transistor cells 106.

According to FIGS. 3A and 3B and above descriptions, this invention discloses a vertical DMOS power device 100 formed in a semiconductor substrate 105 with a top surface and a bottom surface. The power device includes a core cell area 108 and a gate runner area 102 formed in a semiconductor substrate with a top surface and a bottom surface. The power device includes a plurality of vertical DMOS transistor cells 106 disposed in the core cell area 108 wherein each transistor cell 106 includes a drain of a first conductivity type disposed at the bottom surface of the substrate 105. Each of the DMOS transistor cells 106 further includes a trench surrounding the cell having a polysilicon disposed in the trench defining a gate 125 for the transistor cell 106. Each of the transistor cells further includes a source region 140 of the first conductivity type disposed in the substrate near the gate 125. Each of the transistor cells further includes a body region 130 of a second conductivity type disposed in the substrate between the gate 125 wherein the body region 130 defining a vertical current channel along the trench between the source 140 and the drain 105. The power device 100 further includes a plurality of trenched polysilicon fingers 112 extended from the trenched gate to the gate metal area 102. The power device 100 further includes a plurality of ruggedness enhancing body dopant regions 130' of the second conductivity type disposed in the substrate between the trenched polysilicon fingers 112 each of the ruggedness enhancing body dopant regions 130' further includes a breakdown-inducing-regions 185 disposed at bottom of the body dopant region 130' at a depth below the trenched gate-extension fingers 112 having a higher dopant concentration of the second conductivity type for inducing a breakdown therein. In a preferred embodiment, each of the vertical DMOS cells 106 further includes a deep high concentration dopant region 138 disposed in the body region 130 below the source region 140 having a higher dopant concentration than the body region 130. In a preferred embodiment, the power device further includes a trenched gate runner 114 include a trench with a gate-runner polysilicon therein, the trenched gate runner 114 intersecting the polysilicon fingers, and the gate runner having a width substantial greater than the polysilicon fingers 112 provided for forming a gate contact thereon. In a preferred embodiment, the trenched gate runner having a width of about two to three micrometers and the polysilicon fingers having a width of about one micrometer. In another preferred embodiment, the first conductivity type is a N-type conductivity and the vertical DMOS transistor cells 106 are N-channel DMOS cells. In another preferred embodiment, the breakdown inducing regions 185 between the trenched polysilicon fingers are in electrical contact with each other through a deep body dopant region underneath the polysilicon fingers 112 thus constituting an integrated ruggedness enhancing body dopant regions in the gate runner area.

In summary, the present invention discloses a semiconductor power device 100 formed in a semiconductor substrate 105 with a top surface and a bottom surface, the power device comprising a core cell area 108 and a gate runner area 102, the core cell area 108 includes a plurality of transistor cells 106 each includes a drain 105 disposed at the bottom surface, a source 140 and a body region 130 in the substrate and a trenched gate 125 disposed in a trench opened from the top surface. The power device 100 further includes a plurality of trenched gate-extension fingers 112 extended from the trenched gate 125 to the gate runner area 102. The power device 100 further includes a plurality of ruggedness enhancing body dopant regions 130' disposed in the substrate between the gate-extension fingers 112 each of the ruggedness enhancing body dopant regions further includes a breakdown-inducing-regions 185 disposed at bottom of the body dopant region at a depth below the trenched gate-extension fingers 112. In a preferred embodiment, each of the transistor cells 106 further includes a deep high concentration dopant region 138 disposed in the body region 130 below the source 140 having a higher dopant concentration than the body region.

Figure 4C:
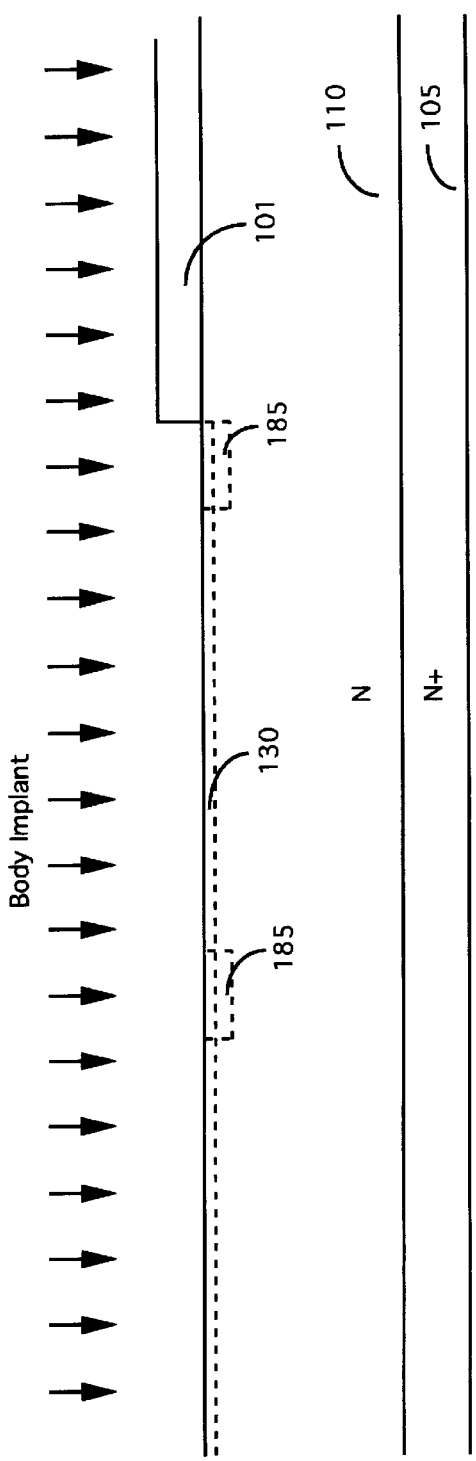
Figure 4D:
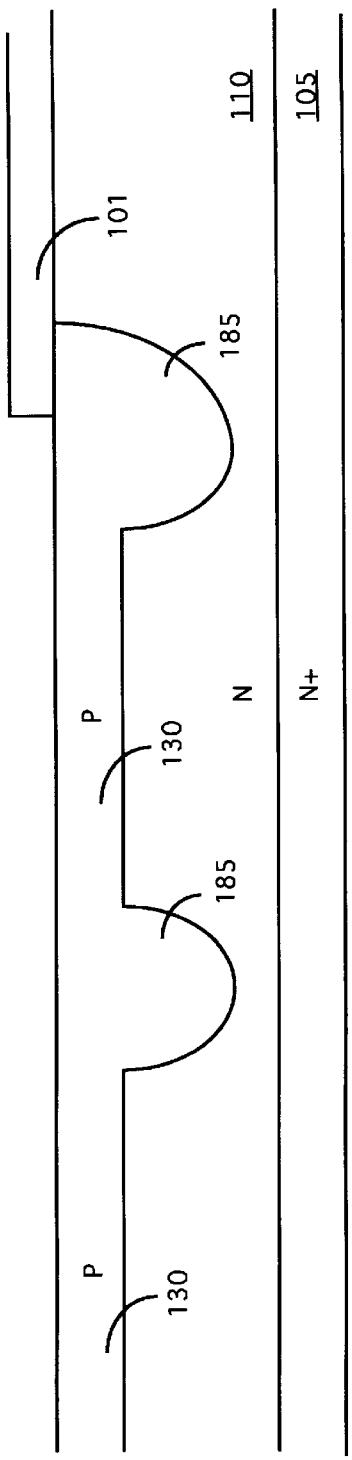

Please refer to FIGS. 4A to 4H for the processing steps carried out to manufacture a power DMOS device 100 of this invention. As shown in FIG. 4A, the processing steps begins by first growing a N epitaxial layer 110 with a resistivity ranging from 0.1 to 1.0 ohm-cm on top of a N+ substrate 105. The substrate has a resistivity of 0.001 to 0.007 ohm-cm. The thickness and the resistivity of the epitaxial layer 110 depend on the device requirements for the on-resistance and breakdown voltage. In a preferred embodiment, the thickness of the epi-layer 110 is about three to twenty microns (3–20 mm). An initial oxidation process is performed to grow an oxide layer 101 ranging from 4,000 to 10,000 Å. An active mask is employed to remove the initial oxide layer 101 to define the active regions. A deep-body mask, as shown in FIG. 4B, is applied to carry out a body dopant, i.e., a boron implant, at an energy of 150–300 Kev with $1 \times 10^{15}$ to $1 \times 10^{16}/cm^2$ flux density to form the breakdown inducing body dopant regions 185 between the polysilicon fingers 112 near the gate metal area 102. A blank p-body implant is carried out with boron ions at 30–100 Kev with an ion beam of $2 \times 10^{13}$ to $5 \times 10^{14}/cm^2$ flux density to form the p-body region 130. A p-body diffusion process is then carried out at an elevated temperature of 1,000–1,200° C. for ten minutes to three hours to increase the depth of the p-body region 120 to 1.0–2.0 m.

Referring to FIG. 4E, with a photoresist employed as a trench mask (not shown), a trench etch process, which is a dry anisotropic etch process, is applied to form trenches of 1.0 to 2.0 microns in width and 1.0 to 2.0 micron in depth. A sacrification oxidation process is applied which can be either a dry or wet oxidation process conducted at a temperature of 900–1100° C. to form oxide layer of approximately 300–2000 Å in thickness which is followed by a sacrification oxide etch process. A gate oxide layer 122 is then formed by a gate oxidation process which can be a wet or dry oxidation process carried out at a temperature of 800 to 1100° C. to form a layer of thickness in the range of 200 to 1,000 Å. In FIG. 4E, a polysilicon deposition process is performed to deposit a polysilicon layer 125 ranging from 1.5 to 3.0 m in thickness. A total etch process is performed to remove the polysilicon layer 125 and leaving only the gate material, e.g., the polysilicon in the bottom part of the trenches. A POCL$_3$ doping process is carried out at 950° C. to make the polysilicon layer 125 have a sheet resistance of 20–40 ohm/cm$^2$. Then a N$^+$ block source mask 135 is applied to carry out an N$^+$ implant to form the N$^+$ region 140. The N$^+$ implantation is carried out with an arsenic or phosphorus ion beam 124 at an energy of 40–100 Kev and ion flux density of $5 \times 10^{15}$ to $1 \times 10^{16}/cm^2$ to form a plurality of N+ source region s 140.

Figure 4G:
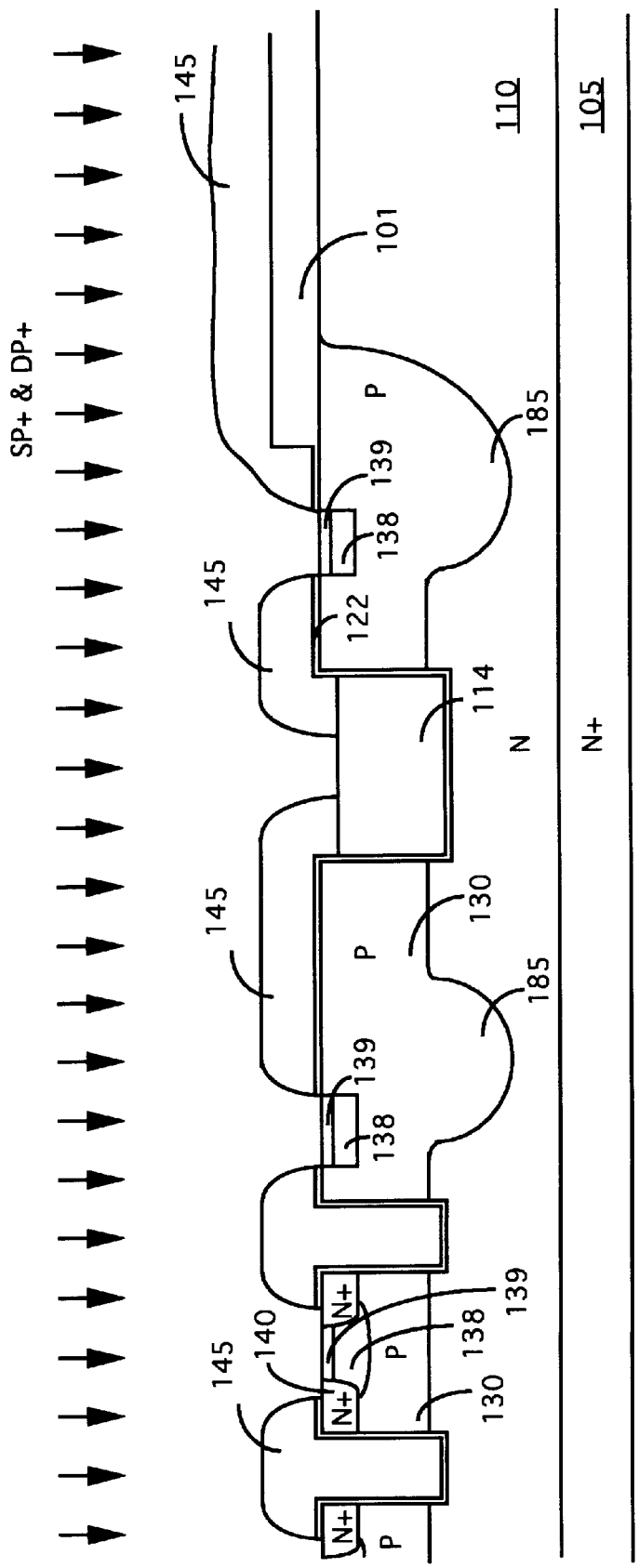
Figure 4H:
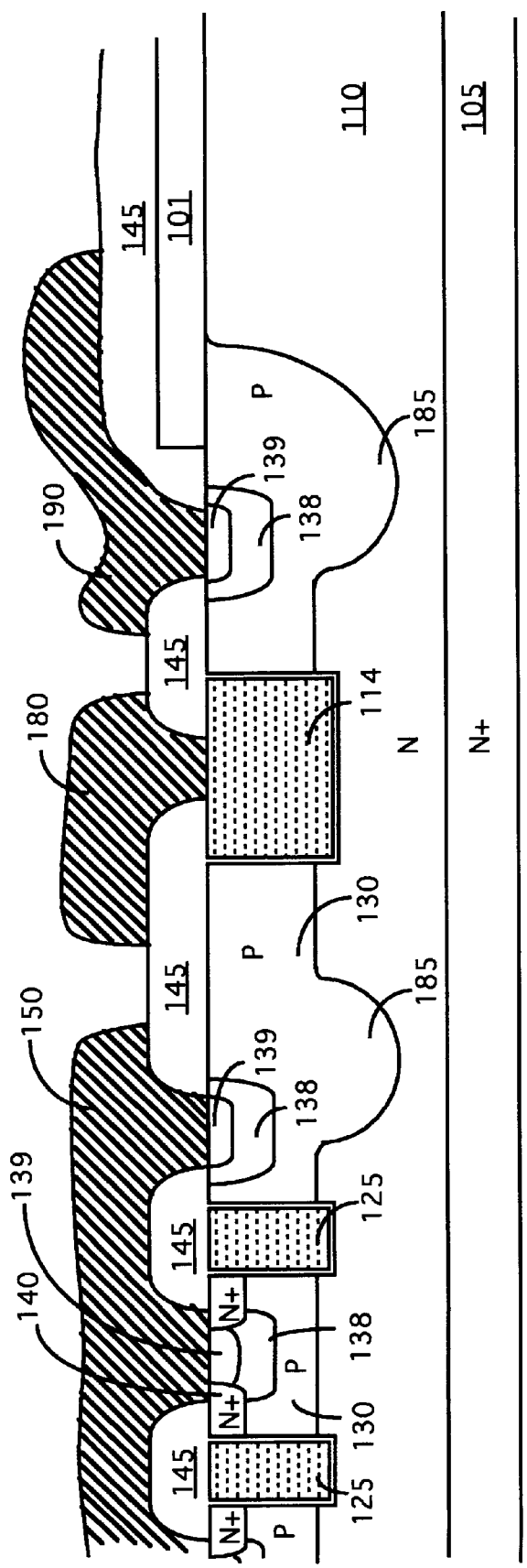

Referring to FIG. 4F, the resist, i.e., the N+ blocking mask 135, is stripped and the N+ source regions 140 are driven into desired junction depth ranging from 0.2 to 1.0 m by a diffusion process at a temperature of 900–1000° C. for 10 minutes to two hours. In FIG. 4G, an insulation layer 145, e.g., a BPSG or a PSG layer of approximately 5000–15,000 Å in thickness is deposited over the entire surface. A BPSG flow or BSG densification process is performed at 900–950° C. for thirty minutes to one hour. In FIG. 4H, a contact mask is employed to etch through the BPSG or the BSG insulation layer 145 to open a plurality of source contact openings in the core cell area and gate contact in the gate runner area 102. A below-the source body dopant implant is performed by implanting through the contact openings with boron ions at 100–200 Kev with an ion beam of $5 \times 10^{14}$ to $5 \times 10^{15}/cm^2$ flux density thus forming a plurality of below-the source-body dopant regions 138 underneath the source regions 140. These below-the source body-dopant regions 138 are useful to reduce the parasitic resistance and thus increasing the device ruggedness. A shallow body dopant implant is then carried out also through the contact openings with boron ions at 30–80 Kev with an ion beam of $2 \times 10^{14}$ to $1 \times 10^{15}/cm^2$ flux density thus forming a shallow high concentration body dopant regions 139 to reduce the contact resistance and further improve the device ruggedness. A layer of contact metal is deposited over the entire top surface. A metal mask is then employed to etch and define the source contacts 150 and the gate contact 180. As that shown in FIG. 3C, because these deep body dopant breakdown regions 185 are formed with a depth greater than the bottom of the trenches, all the body regions 130' near the ploy fingers 112 are now interconnected with a portion of the deep body dopant breakdown regions underneath the trenched polysilicon fingers 112. The device ruggedness are now further strengthened because all the body regions which are previous divided by into smaller sub-regions are now integrated as one integrated body region with much greater volume.

According to FIGS. 4A to 4H and above description, the present invention further discloses a method for fabricating a DMOS power device on a substrate which has high cell density, enhanced ruggedness and reduced JFET resistance. The method includes the steps of: (a) forming an epi-layer 110 of a first conductivity type as a drain region on the substrate 105 followed by growing an initial oxide layer 101 and applying an active mask for etching and defining an active region; (b) applying a breakdown inducing mask for implanting a plurality of deep body dopant regions 185 near a gate metal area 102; (c) performing a blank body implant with impurities of a second conductivity type followed by a body-diffusion process at an elevated temperature thus forming a body layer 130; (d) applying a trench mask for etching the a plurality of trenches includes a plurality of polysilicon finger trenches 112 extending from the core cell area 108 to the gate runner area 102; (e) removing the trench mask followed by depositing and removing a gate material from the top surface of the substrate thus forming a plurality of gates 125 and polysilicon fingers 112 extending from the core cell area 108 to the gate runner area 102; (f) applying a source mask 135 for performing source implant for forming a plurality of source regions 140 followed by removing the source mask 135; (g) depositing an insulation layer 145 on top of the power device followed by applying a contact mask for opening a plurality of source and gate openings followed by removing the contact mask; and (h) depositing a contact metal layer and applying a metal mask for etching and defining the gate and source metals. In a preferred embodiment, the step (g) of opening a plurality of source and gate contact openings further includes a step (g1) of performing a below-the-source high concentration body dopant implant through the source and gate openings to form a plurality of below-the-source high concentration body dopant regions 138 in the body regions below the source regions before removing the contact mask In another preferred embodiment, the step (g) further includes a step of (g2) performing a shallow body dopant implant for forming a plurality of shallow high concentration body dopant regions in the body region to reduce the contact resistance.

Figure 5A:
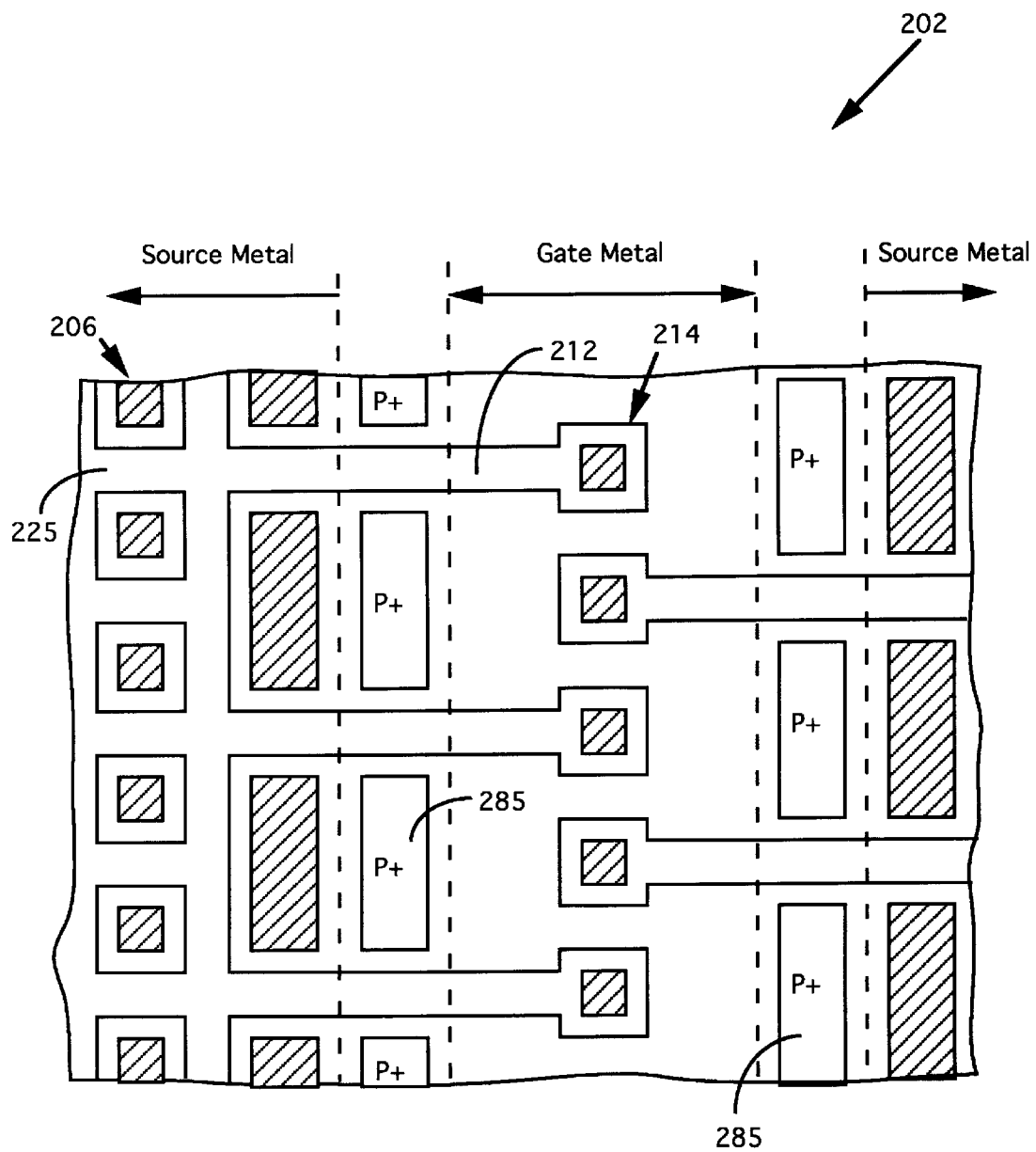
FIG. 5A is a top view for another preferred embodiment of the present invention showing the structures of the transistor cells and the breakdown inducing regions for strengthening the device ruggedness between the trenched polycilicon finger near the gate runner.
Figure 5B:
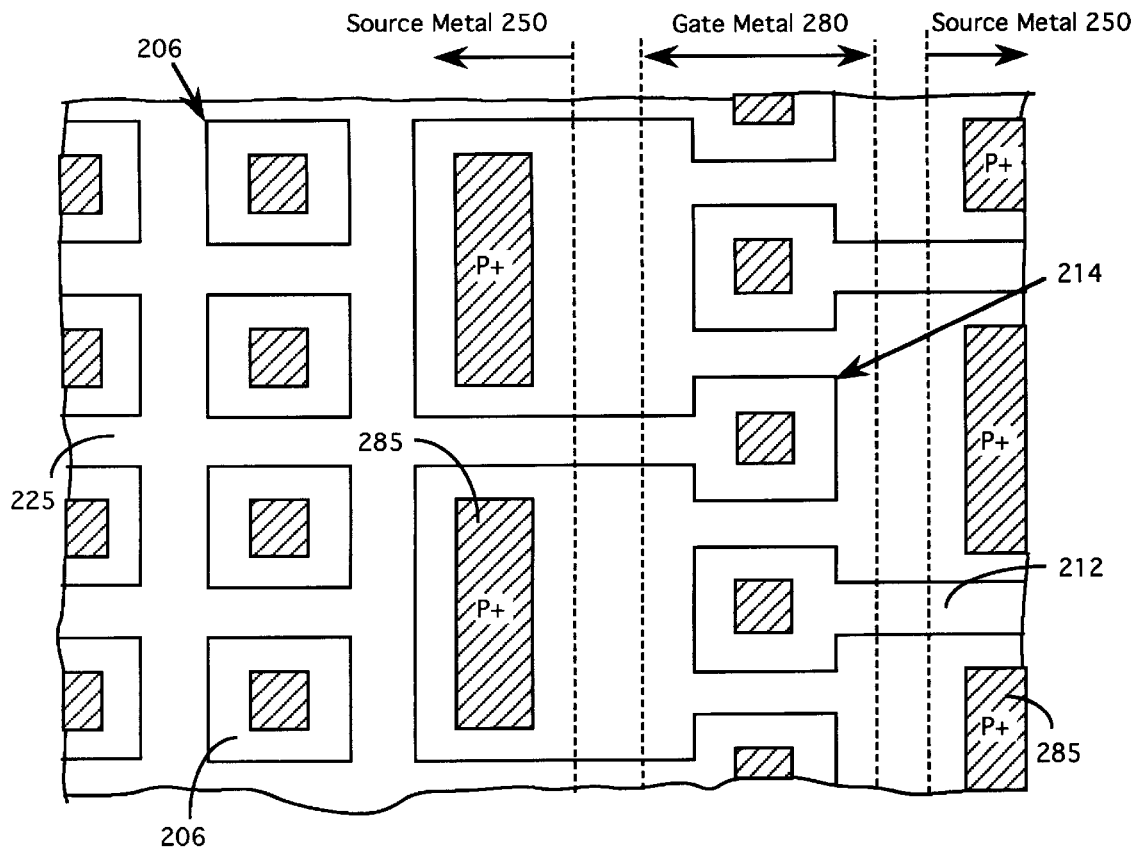
FIGS. 5B and 5C are a top view and a cross sectional view of another preferred embodiment where the breakdown inducing regions are formed directly under the source contact openings.
Figure 5C:
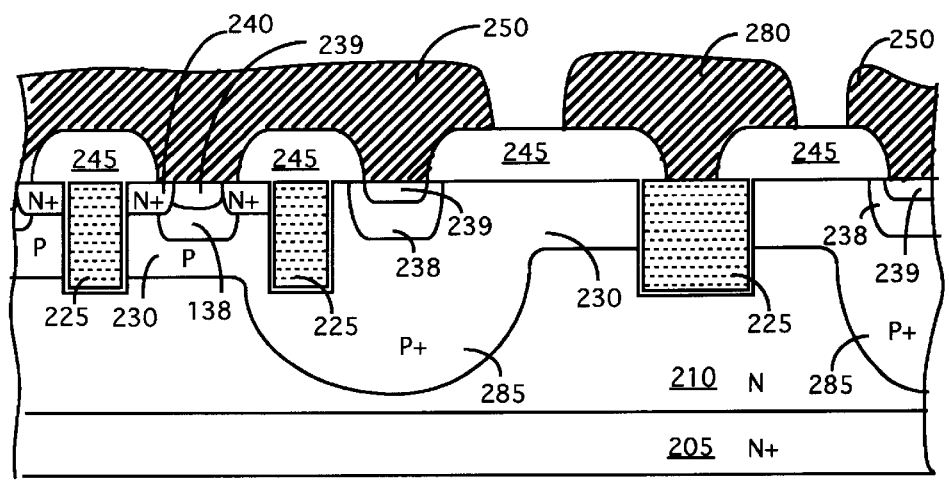

Referring to FIG. 5A, for an alternate preferred embodiment of a DMOS power device 200 of the present invention. The polysilicon fingers 212 are formed with an inter-digit configuration to extend from alternate trench gates 225 toward the gate metal area 202. Similar to the DMOS device 100 as described above, a deep body-dopant breakdown inducing regions 285 are formed through high energy body dopant implant by applying a deep-body mask before the regular body implant is carried out. These deep body-dopant breakdown inducing regions are formed with great depth than the bottom of the trenches for the polysilicon fingers 212. Again, the device ruggedness is improved because the breakdown is now induced to occur at a deep body region which not only has greater depth but also are connected together as an integrated body region having a greater volume. In this embodiment, instead of forming a gate runner as that implemented in DMOS device 100, an enlarged fingerend region 214 is formed at the end of the extended polysilicon fingers 212 to provide larger contact areas to the trenched polysilicon fingers 212. Contacts to the gates are provided by openings above these expanded finger-end regions through the insulation layer to for depositing a gate contact metal layer in these openings thus contact the trenched polysilicon in the expanded finger-end expanded regions 214. FIGS. 5B and C show a top view and a cross sectional view respectively for an alternate preferred embodiment where the deep body dopant breakdown inducing regions 285 are formed right below the high concentration body-dopant regions 238 under the source contact openings where the source metal 250 contacts the source regions 240. The ruggedness of the DMOS is further improved because the shorter distance between the breakdown inducing regions 285 and the source metal 250. The positively charged holes generated during the avalanche breakdown are immediately drawn to the source metal 250 without leaving the local areas to flow toward the core cells 260. The likelihood of incidental turning on of the parasitic NPN bipolar transistors caused by large amount of free charged holes are further reduced because the breakdown inducing regions 285 are formed closer to the contact points to the source metal 250.

Therefore, the present invention provides an improved trenched DMOS structure, and fabrication process to overcome the difficulties weakened device ruggedness for device of high cell density as encountered in the prior art. Specifically, an improved trench DMOS structure and fabrication process are provided in this invention wherein the high density DMOS device is manufactured with a breakdown inducing region by forming deep body dopant region between the polysilicon fingers in the gate runner area such that an avalanche breakdown is induced to first occur in the deep body dopant region without any effect to the transistor cells in the core cell area. Furthermore, each of the DMOS transistor cells is manufactured with body region which is shallower than the trenched gate and within the body region a below-the-source high concentration body dopant region and a shallow high concentration body dopant region are formed such that the parasitic resistance and contact resistance are reduced. Additionally, the DMOS device is manufactured with an integrated body regions of greater volume and each of these integrated body regions is provided with a breakdown inducing region by forming deep body dopant region between the polysilicon fingers in the gate runner area such that the device ruggedness is further improved because the breakdown is induced to occur in the bottom of the integrated body regions which have greater volumes to directly draw the avalanche breakdown current to the source metal outside of the core cell areas. A latch up of the core cell area caused by random breakdown currents entering into the core cell area is prevented.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A vertical DMOS power device includes a core cell area and a gate runner area formed in a semiconductor substrate with a top surface and a bottom surface, said power device comprising a plurality of vertical DMOS transistor cells disposed in said core cell area wherein each transistor cell includes a drain of a first conductivity type disposed at said bottom surface of said substrate;

each of said transistor cells further includes a trench surrounding said cell having a polysilicon disposed in said trench defining a gate for said transistor dell;

each of said transistor cells further includes a source region of said first conductivity type disposed in said substrate near said gate;

each of said transistor cells further includes a body region of a second conductivity type disposed in said substrate between said gate wherein said body region defining a vertical current channel along said trench between said source and said drain;

a plurality of trenched polysislicon fingers extended from said trenched gate to said gate runner area;

a plurality of ruggedness enhancing body dopant regions of said second conductivity type disposed in said substrate between said trenched polysilicon fingers in said gate runner area and in a termination area near a periphery of said substrate wherein each of said ruggedness enhancing body dopant regions further includes a breakdown-inducing-regions disposed at bottom of said body dopant region at a depth below said trenched gate-extension fingers having a higher dopant concentration of said second conductivity type for inducing a breakdown therein; and a trenched gate runner includes a trench with a gate-runner polysilicon therein, said trenched gate runner intersecting said polysilicon fingers, and said gate runner having a width substantial greater than said polysilicon fingers provided for forming a gate contact therein.

2. The vertical DMOS power device of claim 1 wherein:
said trench gate runner having a width of about two to three micrometers and said polysilicon fingers having a width of about one micrometer.

3. The vertical DMOS power device of claim 1 wherein:
said first conductivity type is a N-type conductivity and said vertical DMOS transistor cells are N-channel DMOS cells.

4. The vertical DMOS power device of claim 1 wherein:
said first conductivity type is a P-type conductivity and said vertical DMOS transistor cells are P-channel DMOS cells.

5. The vertical DMOS power device of claim 1 wherein:
said breakdown inducing regions between said trenched polysilicon fingers are in electrical contact with each other through a deep body dopant region underneath sand polysilicon fingers thus constituting an integrated ruggedness enhancing body dopant regions in said gate runner areas.

6. A vertical DMOS power device includes a core cell area and a gate runner area formed in a semiconductor substrate with a top surface and a bottom surface, said power device comprising a plurality of vertical DMOS transistor cells disposed in said core cell area wherein each transistor cell includes a drain of a first conductivity type disposed at said bottom surface of said substrate;

each of said transistor cells further includes a trench surrounding said cell having a polysilicon disposed in said trench defining a gate for said transistor dell;

each of said transistor cells further includes a source region of said first conductivity type disposed in said substrate near said gate;

each of said transistor cells further includes a body region of a second conductivity type disposed in said substrate between said gate wherein said body region defining a vertical current channel along said trench between said source and said drain;

a plurality of trenched polysislicon fingers extended from selected gates among said trenched gates to said gate runner area thus providing several wide areas between said polysilicon fingers;

a plurality of ruggedness enhancing body dopant regions of said second conductivity type disposed in said substrate in said wide areas between said trenched polysilicon fingers each of said ruggedness enhancing body dopant regions further includes a breakdown-inducing-regions disposed at bottom of said body dopant region at a depth below said trenched gate-extension fingers having a higher dopant concentration of said second conductivity type for inducing a breakdown therein; and each of said polysilicon fingers further includes an enlarged trench-end disposed at an end of each polysilicon fingers having an enlarged trench with a gate contact polysilicon disposed therein provided for forming a gate contact thereon.

7. The vertical DMOS power device of claim 6 wherein:
said body region further includes a shallow high concentration body dopant region disposed near said top surface in said body region for reducing a contact resistance of said DMOS power device.

8. The vertical DMOS power device of claim 6 wherein:
each of said enlarged trenched-ends having a length and width of about two to three micrometers and said polysilicon fingers having a width of about one micrometer.

9. The vertical DMOS power device of claim 6 wherein:
said first conductivity type is a N-type conductivity and said vertical DMOS transistor cells are N-channel DMOS cells.

10. The vertical DMOS power device of claim 6 wherein:
said breakdown inducing regions disposed in said wide areas between said trenched polysilicon fingers are provided with a width substantially greater than a width of said transistor cells for further improving a ruggedness of said power device.

11. A semiconductor power device formed in a semiconductor substrate with a top surface and a bottom surface, said power device comprising a core cell area and a gate runner area, said core cell are includes a plurality of transistor cells each includes a drin disposed at said bottom surface, a source region and a body region in said substrate and a trenched gate disposed in a trench opened from said top surface, said power device further comprising a plurality of trenched gate-extension fingers extended from said trenched gates to said gate runner area; and a plurality of ruggedness enhancing body dopant regions disposed in said substrate between said gate-extension fingers, each of said ruggedness enhancing body dopant regions further includes a breakdown-inducing-regions disposed at bottom of said body dopant region at a depth below said trenched gate-extension fingers;

each of said gate-extension fingers further includes an enlarged trench-end disposed at an end of each gate-extension fingers having an enlarged trench with a gate contact polysilicon disposed therein provided for forming a gate contact thereon.

12. The power device of claim 11 wherein:

each of said enlarged trenched-ends having a length and width of about two to three micrometers and said gate-extension fingers having a width of about one micrometer.

13. The vertical DMOS power device of claim 11 wherein:

said source regions of said transistor cells are of a first conductivity type and said body regions are of a second conductivity type and said first conductivity type is a N-type conductivity and said vertical DMOS transistor cells are N-channel DMOS cells.

14. The vertical DMOS power device of claim 11 wherein:

said source regions of said transistor cells are of a first conductivity type and said body regions are of a second conductivity type and said first conductivity type is a P-type conductivity and said vertical DMOS transistor cells are P-channel DMOS cells.

15. The power device of claim 11 wherein:

said plurality of trenched gate-extension fingers extended from selected gates among said trenched gates to said gate runner area thus providing several wide areas between said gate-extension fingers; and said breakdown inducing regions disposed in said wide areas between said trenched polysilicon fingers are provided with a width substantially greater than a width of said transistor cells for further improving a ruggedness of said power device.

* * * * *